(12) United States Patent
Matsui et al.

(10) Patent No.: US 7,906,731 B2
(45) Date of Patent: Mar. 15, 2011

(54) LIGHT EMITTING MODULE, LIGHTING DEVICE AND DISPLAY DEVICE

(75) Inventors: Nobuyuki Matsui, Osaka (JP); Hideo Nagai, Osaka (JP); Keiji Nishimoto, Osaka (JP); Toshifumi Ogata, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/612,553

(22) Filed: Nov. 4, 2009

(65) Prior Publication Data
US 2010/0046232 A1 Feb. 25, 2010

Related U.S. Application Data

(62) Division of application No. 11/577,584, filed as application No. PCT/JP2005/019846 on Oct. 24, 2005, now Pat. No. 7,728,231.

(30) Foreign Application Priority Data

Nov. 1, 2004 (JP) ................................. 2004-318493

(51) Int. Cl.
*H01L 33/00* (2010.01)
(52) U.S. Cl. .................. 174/252; 362/249.02; 362/294; 362/373; 257/99
(58) Field of Classification Search .......... 174/250–268; 257/99; 362/294, 373, 371, 652, 646, 249.02, 362/249.11
See application file for complete search history.

(56) References Cited

U.S. PATENT DOCUMENTS

| | | | |
|---|---|---|---|
| 5,172,755 A | 12/1992 | Samarov | |
| 5,508,560 A | 4/1996 | Koehler et al. | |
| 5,981,036 A | 11/1999 | Schulz-Harder et al. | |
| 7,021,799 B2 | 4/2006 | Mizuyoshi | |
| 7,077,544 B2 | 7/2006 | Parker | |
| 7,256,353 B2 * | 8/2007 | Osanai et al. | 174/252 |
| 7,344,296 B2 | 3/2008 | Matsui et al. | |
| 7,728,231 B2 * | 6/2010 | Matsui et al. | 174/252 |
| 2002/0048174 A1 | 4/2002 | Pederson | |
| 2003/0189829 A1 | 10/2003 | Shimizu et al. | |
| 2004/0213016 A1 | 10/2004 | Rice | |

FOREIGN PATENT DOCUMENTS

| | | |
|---|---|---|
| JP | 2004-265619 | 9/2004 |
| JP | 2004-265626 | 9/2004 |

* cited by examiner

*Primary Examiner* — Anabel M Ton

(57) ABSTRACT

A lighting device includes a heatsink 70, a socket 10 and an LED module 60. The LED module 60 has a light emitting unit 62 in a central part of a top side of a metal base substrate 63 composed of an insulating plate and a metal plate. The LED module 60 is warped such that the central part protrudes on a heatsink 70 side, which is the side opposite to the light emitting unit 62 side. The LED module 60 is mounted on the heatsink 70 in a state of the surrounds of the light emitting unit 62 being pressed according to pressing units 14T, 14L, and 14D of the socket 10. Pressing the surrounds of the light emitting unit 62 against the heatsink 70 ensures that a central part of the warping of the LED module 60 contacts the heatsink 70.

30 Claims, 11 Drawing Sheets

ENLARGEMENT

CROSS SECTIONAL VIEW

PROCESS A

PROCESS B

BEFORE PUNCHING

DURING PUNCHING

AFTER PUNCHING

LIGHT EMITTING MODULE, LIGHTING DEVICE AND DISPLAY DEVICE

RELATED APPLICATION

The present application is a divisional application of U.S. patent application Ser. No. 11/577,584 (now U.S. Pat. No. 7,728,231, issued on Jun. 1, 2010) which is a 371 application from PCT/JP2005/019846 filed on Oct. 24, 2004 which claims priority from Japanese Patent Application No. 2004-318493 filed on Nov. 1, 2004.

TECHNICAL FIELD

The present invention relates to a light emitting module that is mounted on a heatsink, and a lighting device and a display device composed of the light emitting module mounted on a heatsink by a socket.

BACKGROUND ART

Inventors have proposed various lighting devices composed of an LED (light emitting) module in which light emitting units are formed on a front surface of a substrate, a heatsink, and a socket for mounting the LED module to the heatsink (for example, see Japanese Laid-Open Patent Application No. 2004-265626 and Japanese Laid-Open Patent Application No. 2004-265619).

The substrate of an LED module is composed of an insulating plate and a metal plate (heat conducting plate) layered together, and the light emitting unit is composed of a plurality of LEDs that are mounted in a central area of the front surface of the insulating plate. The metal plate ensures stiffness of the LED module as well as having a function of conducting heat generated when the light emitting unit (in other words, the LEDS) emits light to the heatsink.

The socket is mounted on a flat surface of the heatsink from over the LED module so as to cover the front side thereof. In this mounted state, pressing units of the socket press against edge parts of the insulating plate, thus having a function of pressing the LED module, in other words the metal plate, against the heat sink.

DISCLOSURE OF THE INVENTION

In the described lighting device, however, there is a problem that even thought the LED module is mounted so as to push against the heatsink, the heat generated when the light emitting unit emits light is not sufficiently conducted to the heatsink. In other words, sufficient heat dissipation properties cannot be obtained in the lighting device.

The present invention was conceived in view of the stated problem, and has a object of proving a light emitting module, a lighting device, and a display device that are capable of improving heat dissipation properties during light emission.

Note that, because heat is generated during operation, the light emitting module requires some kind of measure for heat dissipation (a heat dissipater). Besides a general heatsink, the body of the lighting device or the display device are also assumed to also function as a heatsink. In the present Description, the term heatsink should be interpreted as including all of these.

Means to Solve the Problem

As a result of investigating and analyzing conventional lighting devices, the inventors of the present invention found that when an LED module is in a non-mounted state (i.e. not mounted on a heatsink), the LED module is warped such that the central part of the substrate protrudes on the insulating plate side (the opposite side to the heatsink when mounted on the heatsink). For this reason, even if the LED module is mounted on the heatsink, the edges of the substrate (the parts pushed by the pushing units of the socket) contact the heatsink, while, due to the warping of the substrate, the central part of the back surface of the light emitting unit does not contact the heatsink.

The substrate of the LED module is obtained from a large-sized material having the same structure as the substrate according to a blanking process. Further investigation by the inventors showed that warping occurs in the blanking process.

In order to achieve the stated object, the present invention is a light emitting module used mounted on a heatsink, the light emitting module including: a substrate composed of an insulating plate and a heat conducting plate layered together, and a light emitting unit provided on the insulating plate in a central area of the insulating plate, wherein the substrate is warped such that a central part thereof protrudes on a heatsink side, the heatsink side being a heat conducting plate side of the substrate.

According to the stated structure, when the light emitting module is mounted on the heatsink side, the central part, or the vicinity thereof, of the heat conducting plate contacts the heatsink. When the light emitting unit emits light the central part of the light emitting unit is the hottest part and the light emitting unit is located in the central area that excludes the edge parts of the insulating plate, and therefore the place that is the hottest during light emission and the place that contacts the heatsink when the light emitting module is mounted on the heatsink are close to each other. Therefore, the heat generated during light emission is conveyed effectively from the heat conducting plate to the heatsink.

Furthermore, the present invention is a lighting device including: a heatsink; a light emitting module including a substrate and a light emitting unit, the substrate being composed of an insulating plate and a heat conducting plate layered together, and the light emitting unit being provided on the insulating plate in a central area of the insulating plate; and a socket for mounting the light emitting module on the heatsink such that the light emitting unit is on a front side, wherein the light emitting module is warped such that a central part thereof protrudes on a heatsink side when the light emitting module is in a mounted state on the heatsink.

Furthermore, the present invention is a lighting device including: a heatsink; a light emitting module including a substrate and a light emitting unit, the substrate being composed of an insulating plate and a heat conducting plate layered together, and the light emitting unit being provided on the insulating plate in a central area of the insulating plate; and a socket for mounting the light emitting module on the heatsink such that the light emitting unit is on a front side, wherein the heatsink is warped such that at least a substantially central part of an area thereof in which the light emitting module is to be mounted protrudes on a light emitting module side.

Furthermore, the present invention is a display device including: a heatsink; a light emitting module including a substrate and a light emitting unit, the substrate being composed of an insulating plate and a heat conducting plate layered together, and the light emitting unit being provided on the insulating plate in a central area of the insulating plate; and a socket for mounting the light emitting module on the heatsink such that the light emitting unit is on a front side, wherein the light emitting module is warped such that a central part thereof protrudes on a heatsink side when the light emitting module is in amounted state on the heatsink.

Effects of the Invention

When the light emitting module of the present invention is mounted on a heatsink with, for example, the light emitting unit on the insulating plate at the front side, the part (or the vicinity thereof) of the heat conducting plate that is hottest during light emission contacts the heatsink, and therefore the heat that occurs during light emission is effective conveyed via the heat conducting plate to the heatsink. This improves heat dissipation properties of the light emitting module.

Furthermore, in a lighting device of the present invention, when the light emitting module that is warped such that the central part of the substrates protrudes on the heatsink side is mounted on the heatsink by the socket the part (or the vicinity thereof) of the heat conducting plate of the light emitting module that is hottest during light emission contacts the heatsink and therefore the heat that occurs during light emission is effectively conveyed via the heat conducting plate to the heatsink. This improves heat dissipation properties of the light emitting module.

Furthermore, in a lighting device of the present invention, when the light emitting module is mounted by a socket to a heatsink that is warped such that a central part protrudes on the light emitting module side, the part (or the vicinity thereof) of the heat conducting plate of the light emitting module that is hottest during light emission contacts the heatsink, and therefore the heat that occurs during light emission is effectively conveyed via the heat conducting plate to the heatsink. This improves heat dissipation properties of the light emitting module.

Furthermore, in a display apparatus of the present invention, when the light emitting module that is warped such that the central part of the substrates protrudes on the heatsink side is mounted on the heatsink by the socket, the part (or the vicinity thereof) of the heat conducting plate of the light emitting module that is hottest during light emission contacts the heatsink and therefore the heat that occurs during light emission is effectively conveyed via the heat conducting plate to the heatsink This improves heat dissipation properties of the light emitting module.

Figure 1:
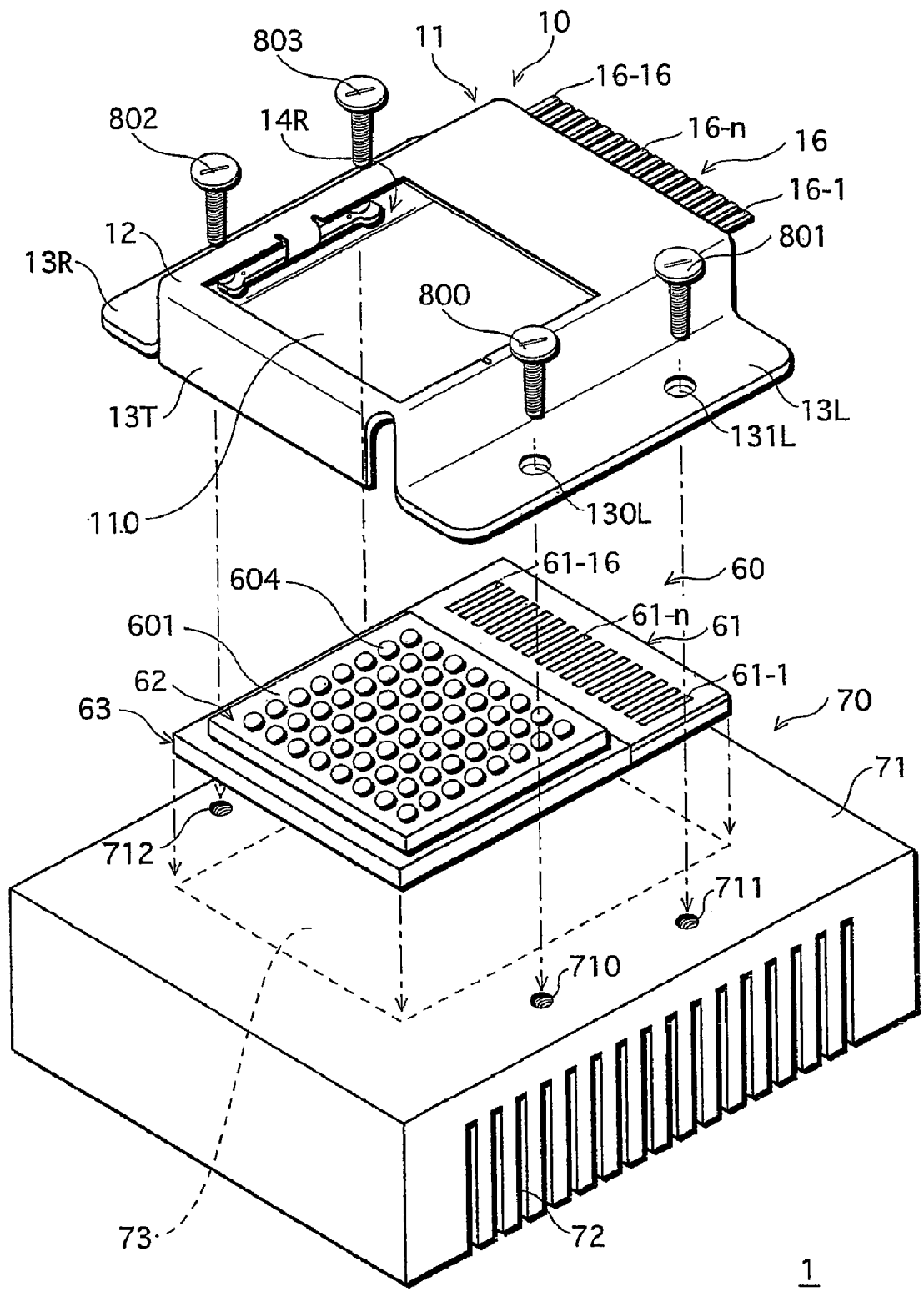
FIG. 1 is a perspective drawing showing a lighting device in an embodiment in a disassembled state.

NUMERICAL REFERENCES 1 lighting device
10 socket
14R, 14L, 14D, 14T pushing units
60 LED module
62 light emitting unit
70 heatsink
71 flat surface

BEST MODE FOR CARRYING OUT THE INVENTION

The following describes a light emitting module of the present invention and a lighting device in which the light emitting module is employed, in an embodiment in which LEDs are used as light emitting elements.

1. Structure of the Lighting Device

FIG. 1 is a perspective drawing showing a lighting device 1 of the embodiment, in a disassembled state.

The lighting device 1, as shown in FIG. 1, is composed of an LED module (corresponding to the light emitting module of the present invention) 60, a heatsink 70, and a socket 10 that mounts the LED module 60 to the heatsink 70.

The LED module 60, which is described in detail later, emits light from a light emission unit which is on a surface thereof. A back surface side of the LED module 60 is a metal plate with superior heat conductivity that transfers the heat generated during light emission (this metal plate corresponds to the heat conducting plate of the present invention) to the heatsink 70. The LED module 60 is mounted to the heatsink 70 by mounting the socket 10 on the heatsink 70 in a state in which the socket 10 is disposed over the LED module 60 so as to cover the front surface of the LED module 60.

(1) Structure of the LED Module 60

Figure 2A:
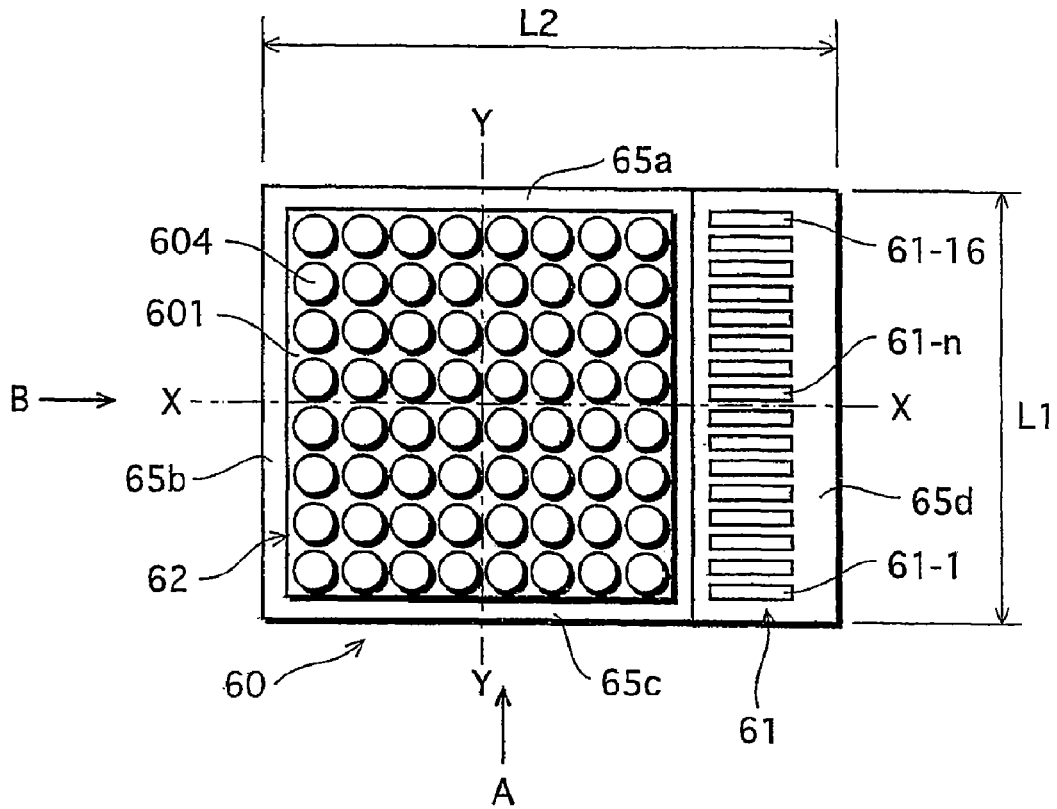
FIG. 2A is a planar drawing of an LED module.
Figure 2B:
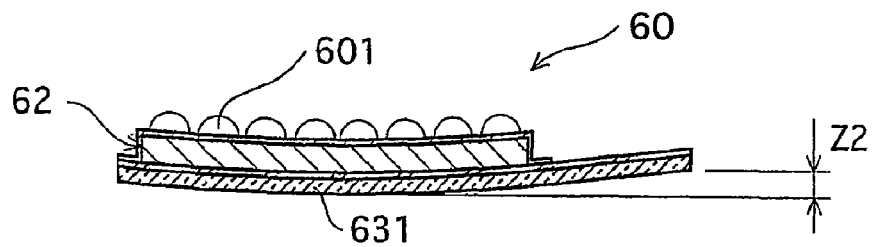
FIG. 2B is a cross section along a line X-X of FIG. 2A as seen from an arrow A direction.
Figure 2C:
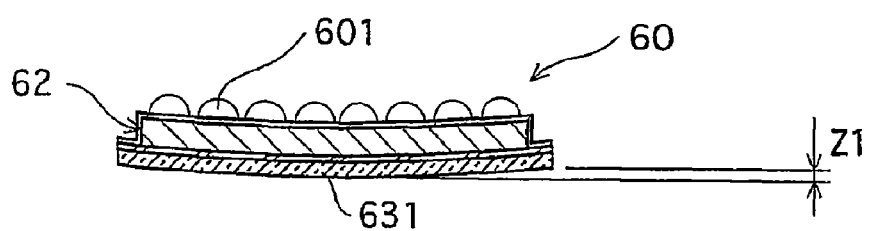
FIG. 2C is a cross section along a line Y-Y of FIG. 2B as seen from an arrow B direction.

FIG. 2A is a planar drawing of the LED module 60, FIG. 2B is a cross section along a line X-X of FIG. 2A as seen from an arrow A direction, and FIG. 2C is a cross section along a line Y-Y of FIG. 2A as seen from an arrow B direction. Furthermore, FIG. 3A is a vertical cross sectional drawing of the LED module 60, and FIG. 3B is an enlarged drawing of the portion of FIG. 3A shown by the broken line.

Figure 3A:
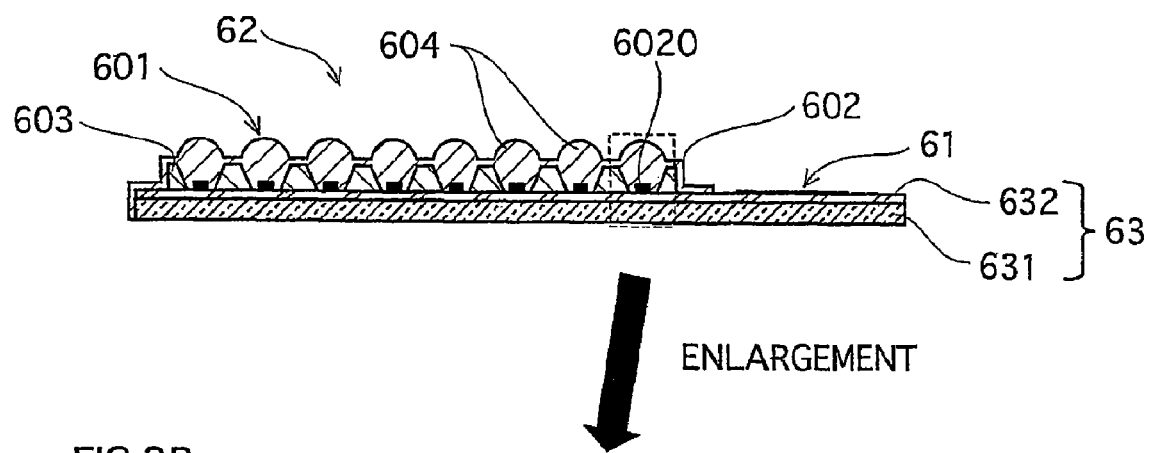
FIG. 3A is a vertical cross sectional drawing of the LED module.

As shown in FIG. 1 to FIG. 3, and in particular in FIG. 2A and FIG. 3A, the LED module 60 is principally composed of an insulating plate 632 that has a light emitting unit 62 and a power unit 61 formed on the front side thereof, and a metal plate 631 that is provided on the bottom side of the insulating plate 632 in order to increase the heat dissipation effect. The insulating plate 632 and the metal plate 631 are a layered structure, and together with a wiring pattern formed on the front surface of the insulating plate 632 for supplying power to the light emitting unit 62, compose a metal base substrate (corresponding to the substrate of the present invention) 63.

Figure 3B:
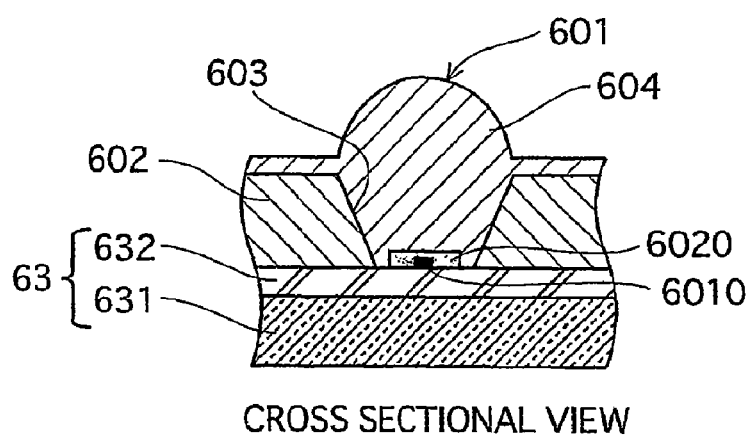
FIG. 3B is an enlarged drawing of a portion of FIG. 3A shown by the broken line.

The light emitting unit 62, as shown in the cross sectional drawing of FIG. 3A and the enlarged drawing of FIG. 3B, is composed of: LEDs 6010 which are mounted on a wiring pattern (not illustrated) formed on the part of the insulating substrate 632 that corresponds to the light emitting unit 62; resin bodies 6020 which cover respective LEDs 6010; a reflective plate 602 that has reflective apertures 603 in parts corresponding to the LEDs 6010; and a lens member 601 of which parts corresponding to the reflective apertures 603 of the reflective plate 602 are lens units 604.

As can be seen from FIG. 2A, in the present embodiment a total of 64 LEDs 6010 are mounted in an eight by eight arrangement in substantially a square shape. Phosphor for converting light emitted from the LEDs 6010 into a desired color of light is included in the resin bodies 6020 that cover the LEDs 6010.

The reflective plate 602 is for reflecting the light emitted from the LEDs 6010 in desired directions. In the present embodiment the reflective plate 602 has trumpet-shaped reflective apertures 603 that widen towards the front side (the side opposite to the insulating plate 632). Note that reason for making the reflective apertures 603 trumpet-shaped is to effectively reflect light emitted from the LEDs 6010 to the front side.

The lens units 604 fill in the reflecting apertures 603 of the reflective plate 602, as well as being shaped so as to protrude as semi-spheres from the front surface of the reflecting plate 602. The lens member 601 including the lens units 604 is made, for example, of highly-transparent resin. Details of the structure of the LED module 60 having the described structure can be found in Japanese Laid-Open Patent Application No. 2003-124528.

The width and length of the insulating plate 632 are greater than the width and length of the light emitting unit 62, thus ensuring a margin surrounding the light emitting unit 62. In other words, the light emitting unit 62 is formed in a central region that excludes peripheral parts 65 of the insulating plate 632.

As shown in FIG. 2A, since in the present embodiment the light emitting module 60 has a flat, rectangular shape when seen in planar view and the light emitting unit 62 has a substantially square shape when seen in planar view, the insulating plate 632 has four periphery parts 65a, 65b, 65c, and 65d on the front surface thereof, corresponding to the four sides of the light emitting unit 62. When describing the periphery parts 65a, 65b, 65c, and 65d without reference to a particular one of the four, the reference numeral 65 is used, although this does not appear in the drawings.

The power unit 61 is for supplying power to the LEDs 6010. In the present embodiment the LEDs 6010 are arranged appropriately in series and in parallel to each other, and each line is electrically connected with a corresponding one of power terminals 61-n (n being an integer from 1 to 16) by a wiring pattern (not illustrated). Note that the power unit 61 receives power from a power terminal unit 16 of the socket 10.

Furthermore, the LED module 60, as shown in FIG. 2B and FIG. 2C, bends such that a central part 631b of the back surface side is convex. In other words, when viewed from each of the A arrow direction and the B arrow direction, the metal base substrate 63 is warped such that the central part 631b of the metal plate 631 is convex on the side that is opposite to the light emitting unit 62. Note that the central part 631b of the metal plate 631 is also the central part of the metal base substrate 63, and the reference numeral 631a is used also to indicate the central part of the metal base substrate 63.

(2) Structure of the Heatsink 70

The heatsink 70 is a metal member (an aluminium member, for example) that is a rectangular solid and is highly heat conductive. A plurality of pectinate fins 72 are disposed on a side of the heatsink 70 that is the opposite side to the side on which the LED module 60 is mounted. These pectin fins 72 heighten the heat dissipation effect.

As shown in FIG. 1, the flat surface 71 on which the LED module 60 is mounted is provided with screw holes 710, 711, 712 and 713 (713 is not illustrated) for screws 800, 801, 802 and 803 to secure the socket 10.

The LED module 60 is placed on and mounted on the flat surface 71 of the heatsink 70 in an area 73 that is located between a line connecting the screw hole 710 and the screw hole 711 and a line connecting the screw hole 712 and the screw hole 713.

(3) Structure of the Socket 10

Figure 4:
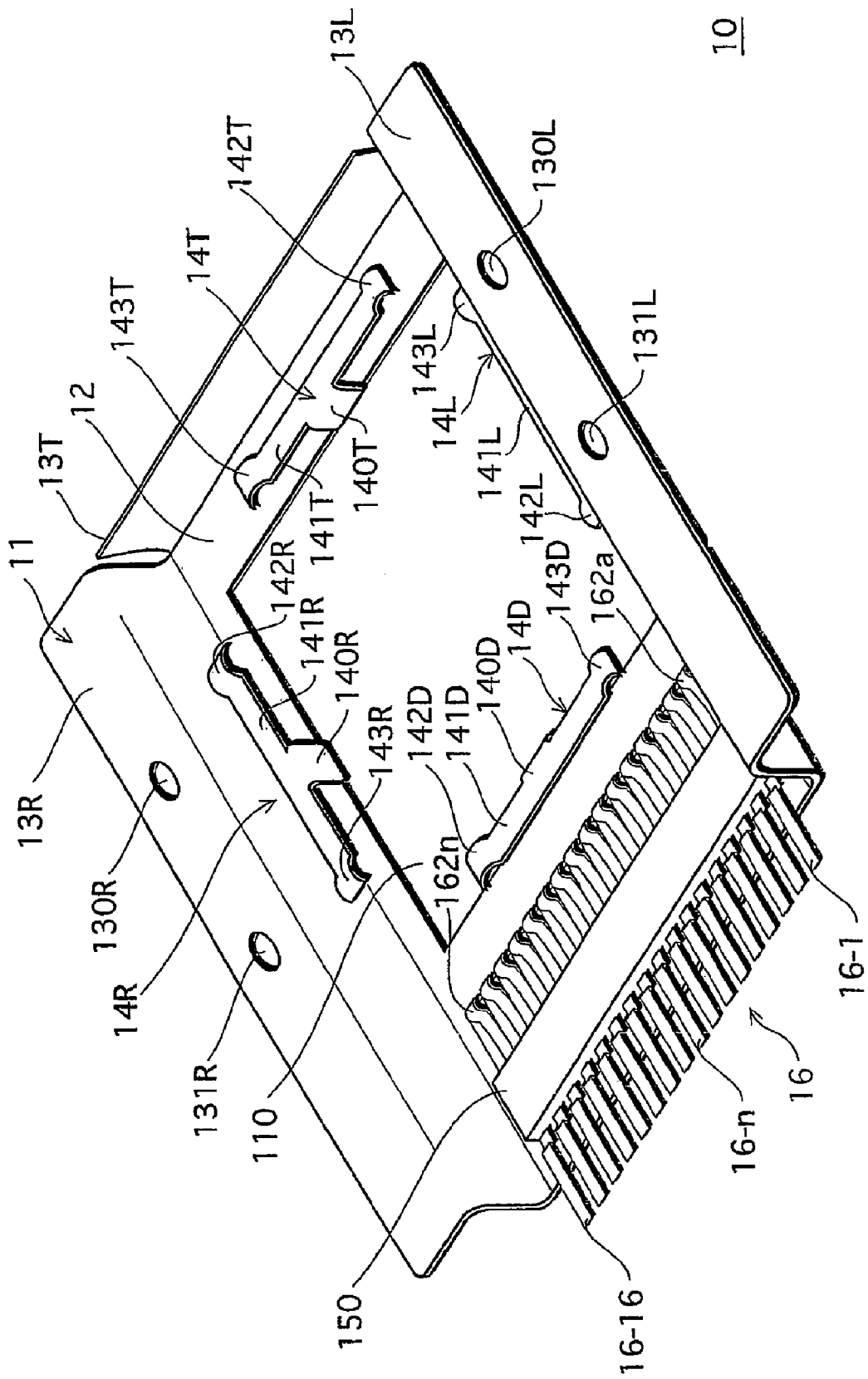
FIG. 4 shows the structure of a bottom side of the socket.

FIG. 4 shows the structure of the bottom side of the socket.

The socket 10, as shown in FIG. 1 and FIG. 4, is composed of a socket main body 11 and external terminals 16. The socket main body 11 is formed by, for example, press machining a stainless steel plate. The socket main body 11 has a main wall 12 and side walls 13R, 13L and 13T that extend respectively from three sides of the four sides of the main wall 12. In the main wall 12 is provided an opening 110 that corresponds to the size of the light emitting unit 62 of the LED module 60.

The side walls 13R and 13L, which are on the longer sides of the main wall 12, bend so as to be substantially at right angles with main wall 12 at a base part with the main wall 12, and further have a right-angled bend at an intermediate part between the base part and a tip part, so as to extend away from the main wall 12. On the other hand, the side wall 13T bends in one place so as to be at substantially a right angle at the base part with the main wall 12 and to extend orthogonal to the main wall 12.

Through holes 130R, 131R, 130L and 131L are provided in the parts of the side walls 13R and 13L that extend parallel with the main wall 12, in locations corresponding to the screw holes 710, 711, 712 and 713 of the heatsink 70.

Note that instead of a stainless steel plate, the socket main body 11 may be made using another material that has superior heat dissipation properties such as brass.

As shown in FIG. 1 and FIG. 4, four pressing units (corresponding to the pressing units of the present invention) 14R, 14L, 14T and 14D are formed on the edges of the socket 110 that surround the opening 110. These pressing units 14R, 14L, 14T and 14D have a spring structure formed integrally with the socket main body 11.

The pressing units 14R, 14L, 14T and 14D are formed by leaving T-shape parts connected to the edge of the opening 110 when punching out the opening 110, and then bending the T-shaped parts. The pressing units 14R, 14L, 14T and 14D are respectively composed of vertical bars 140R, 140L, 140T and 140D (140L is not illustrated), horizontal bars 141R, 141L, 141T and 141D that are supported by the vertical bars 140R, 140L, 140T and 140D respectively, and pressing contact units 142R, 143R, 142L, 143L, 142T, 143T, 142D and 143D that are arc-shaped and provided on either end of respective horizontal bars 141R, 141L, 141T and 141D.

The height of the socket 10 in a thickness direction thereof is designed to be slightly less than the sum of (i) the height of the pressing units 14R, 14L, 14T and 14D and (ii) the height of the LED module 60, in order to ensure that the LED module 60 is pressed against the flat surface 71 of the heatsink 70 by the pressing units 14R, 14L, 14T and 14D.

On the inner surface of the main wall 12, a power terminal unit 16 is provided on the side of the socket main body 11 that does not have a side wall, in a location corresponding to the power terminal 61 of the LED module 60. The power terminal unit 16, as shown in FIG. 4, has a structure in which external terminals 16-n (n being an integer from 1 to 16, and corresponding to the "n" of the power terminals 61-n of the LED module 60) are held by a terminal holding member 150 (insulating housing). The terminal holding member 150 is made of liquid crystal polymer or resin material that is durable, incombustible material or the like. The external terminal's 16-n are made of phosphor bronze that is superior in terms of both electrical conductivity and durability with respect to insertion and removal.

Of the external terminals 16-*n*, the parts that extend from the terminal holding member 150 toward the opening 110 are contact units 162-*n* (n being an integer from 1 to 16, and corresponding to the "n" of the power terminals 61-*n* of the LED module 60). The contact units 162-*n* have a warped shape such that they are convex in a thickness direction of the socket 100, away from the main wall 12 side. Note that the reason that the contact units 162-*n* have this shape is to ensure that they contact (electrically connect with) the power terminals 61-*n* of the LED module 60.

On the other hand, of the external terminals 16-*n*, the parts that extend from the terminal holding member 150 toward the opposite side to the opening 110 are external contact units for receiving power from an external source. These external connection parts are connected via a connecter (not illustrated) to a common LED driving circuit and, by receiving power, are driven as appropriate.

Note that LED module 60 can be removed and replaced by removing the screws 800, 801, 802 and 803 as shown in FIG 1.

2. Mounting of the LED Module 60

Figure 5:
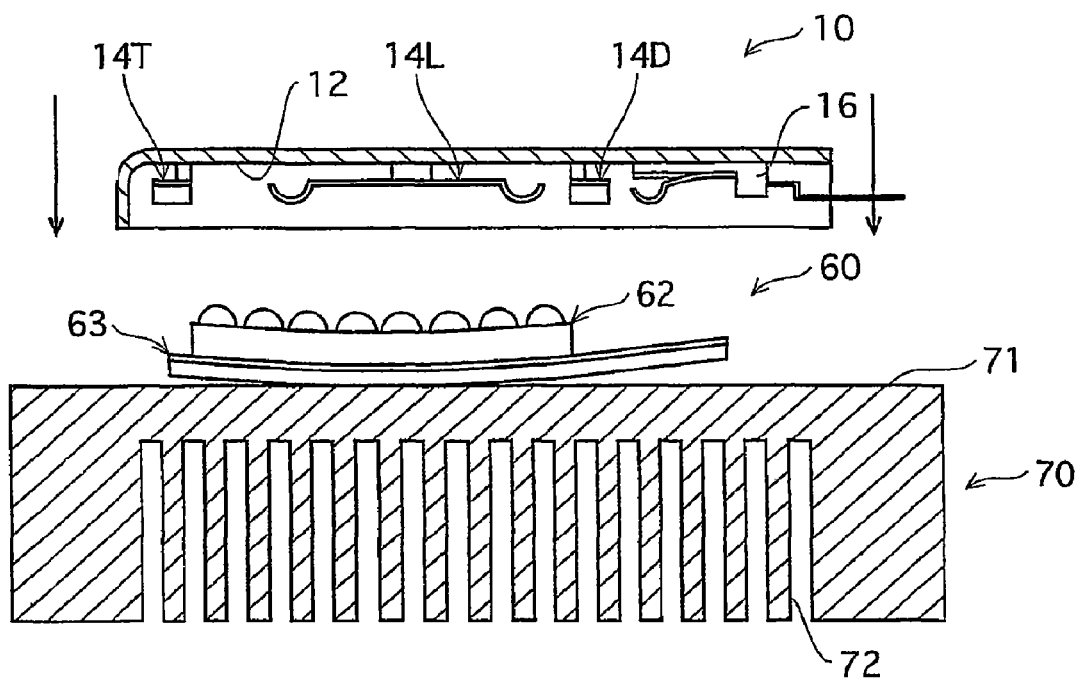
FIG. 5 is for describing the mounting of the LED module.
Figure 5:
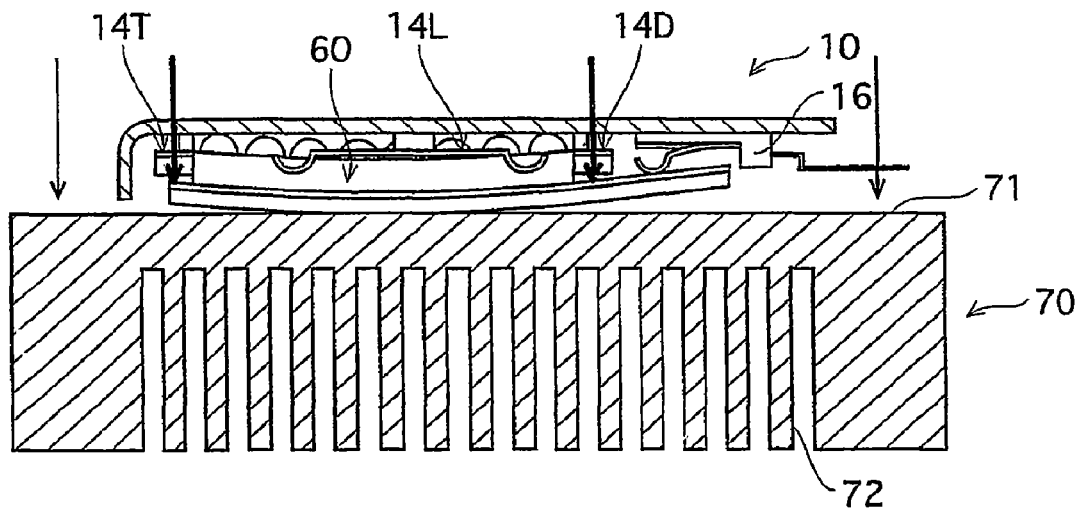

FIG. 5 is for describing mounting of the LED module 60.

The LED module 60 having the described structure is placed on the flat surface 71 of the heatsink 70 as shown in process A in FIG. 5. Next, with the pressing units 14R, 14L, 14T and 14D (14R does not appear in the drawing) facing towards the LED module 60, the socket 10 is lowered from above the LED module 60. The metal base substrate 63 of the LED module 60 in this state is warped such that the central part 63 protrudes on the heatsink-side. The substantially center part 631*b* of the metal plate 631 contacts the heatsink 70.

Next, as shown by process B, the socket 10 is further lowered, and fitted onto the LED module 60 such that the light emitting unit 62 of the LED module 60 fits in the opening 110 of the socket 10. With the socket 10 further pressed against the heatsink 70 side, the screws 800, 801, 802 and 803 (see FIG. 1) are screwed in to fix the socket 10 to the heatsink 70.

When in a state of not being pressed against the heatsink side, the metal base substrate 63 of the LED module 60 is warped such that the central part 631*b* thereof protrudes on the heatsink side. When the LED module 70 is in the mounted state on the heatsink 70, the edge parts 65 of the insulating plate 632 are pressed by the pressing units 14R, 14L, 14T and 14D of the socket 10, thus ensuring that the central part (or the central part and its proximity) of the metal base substrate 63 where heat generation is concentrated during light emission contacts the heatsink 70.

As a result of the described processes, mounting of the LED module 60 to the heatsink 70 with the socket 10 is complete.

3. Implementation Example

The dimensions of the LED module 60 are, as shown in FIG. 2A, as follows: a dimension L1 of the short sides is 23.5 mm, and a dimension L2 of the long sides is 28.5 mm. The metal plate 631 that composes the metal base substrate 63 is a 1 mm-thick aluminium plate, and the insulating plate 632 is 0.1 mm thick and is made of thermosetting resin that includes filler. A wiring pattern is formed on the insulating plate 632 according to etching or the like using 10 μm-thick copper foil. The resin is epoxy resin.

Each LED 6010 mounted on the metal base substrate 63 is substantially cuboid in shape, with a 0.3 mm by 0.3 mm square-shaped base and a height of 0.1 mm, and is made of an InGaN material. Each LED 6010 has a P-type electrode and an N-type electrode on a lower surface, and is flip chip mounted via a bump to a wiring pattern formed on the front surface of the insulating plate 632. Note that the LEDs 6010 are blue-light emitting LEDs, and the phosphor is yellow-light emitting phosphor, and hence the blue light is converted into white light.

The reflective plate 602 is made from a 1 mm-thick aluminium plate, and is attached to the metal base substrate 63 using a white epoxy resin layer. The reason for using a resin layer that is white is to effectively draw light emitted from the LEDs 6010 outside (to the front side).

Note that instead of a metal plate such as aluminium, the reflective plate 602 may be a metal plate of another material, white resin, or resin or the like whose front surface (particularly, the surface that composes the reflective apertures) has been plated. Furthermore, when an aluminium plate is used for the reflective plate 602, the reflecting rate of the reflective plate 602 can be improved and electric insulation can be ensured if, for example, an oxide film is formed on the surfaces that compose the reflective apertures 603 according to alumite treatment.

The lens member 601 is made of translucent resin, specifically, epoxy resin. Instead of epoxy resin, the lens member 601 may be made of a translucent resin such as acrylic resin or silicone resin, or of glass or the like. Furthermore, although the lens units 604 are semi-spherical convex lenses in the present embodiment, their shape may be modified according to purpose.

FIG. 6 shows results of measuring the amount that the LED module is warped.

Figure 6A:
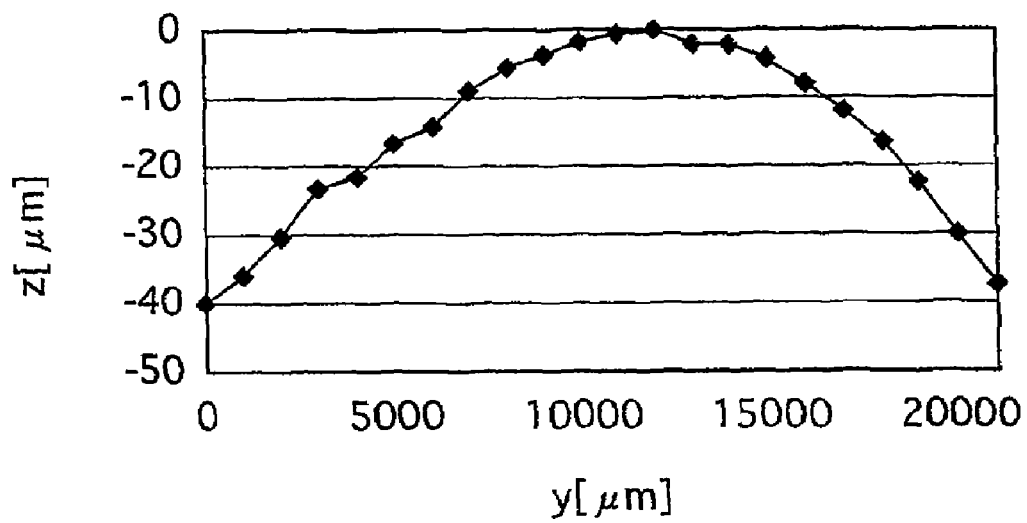
FIGS. 6A and 6B show results of measuring the amount that the LED module is warped.
Figure 6B:
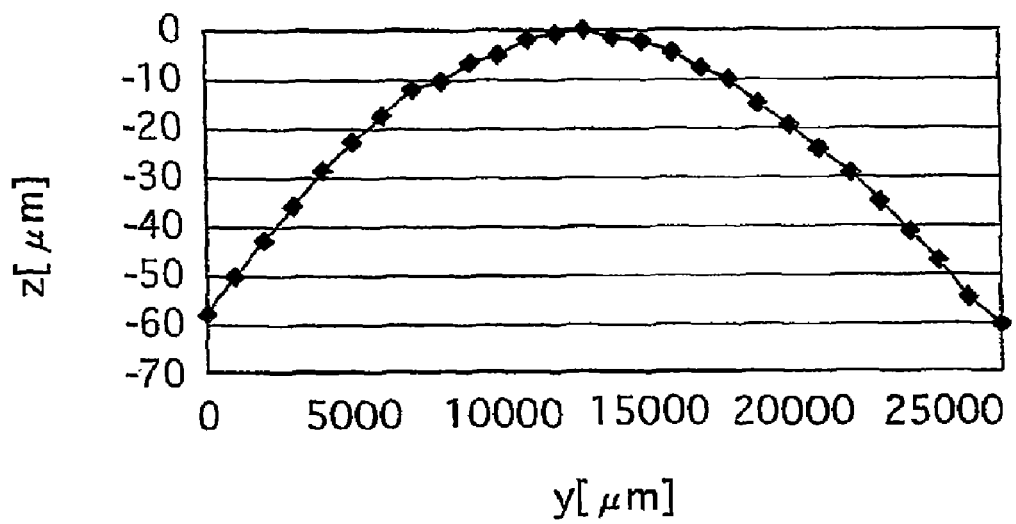

FIG. 6A shows warping Z1 of FIG. 2C, and FIG. 6B shows warping Z2 of FIG. 2B.

The warping of the LED module 60, in other words the displacement in the thickness direction Z1 and Z2 of the surface of the metal plate 631 (the surface of the opposite side to the insulating plate 632) of the metal base substrate 63 with respect to the short sides and the long sides, when the central part 631*b* is used as a reference, gradually becomes concave toward each of the short sides and the long sides. In other words, when seen from either the A arrow direction or the B arrow direction shown in FIG. 2A, the LED module 60 is a convex curve such that the substantially central part 631*b* of the metal base substrate 63 protrudes parabolically on the side opposite to the insulating plate 632.

4. Manufacture of the LED Module 60

FIGS. 7A to 7E illustrate the process for manufacturing the LED module 60.

Figure 7A:
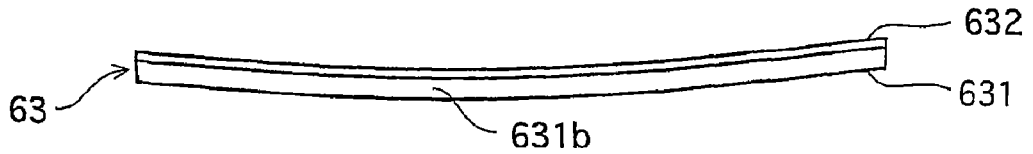
FIGS. 7A to 7E illustrate the process for manufacturing the LED module.

First, the metal base substrate 63 is provided. This metal base substrate 63, as shown in FIG. 7A, already has a warped shape such that the central part 631*b* of the metal plate 631 protrudes on the side opposite to the insulating plate 632. The reason that the metal base substrate 63 is warped is as follows.

FIGS. 8A to 8D illustrate the processing for manufacturing the metal base substrate 63.

Figure 8A:
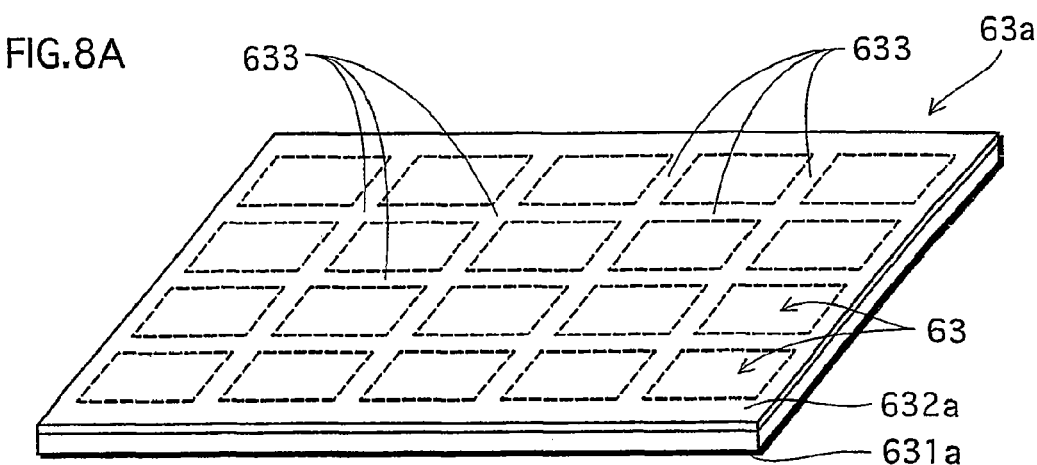
FIGS. 8A to 8D illustrates the processing for manufacturing the metal base substrate.

The metal base substrate 63 used in the LED module 60 is obtained by subjecting a large, original substrate 63*a* such as that shown in FIG. 8A to a blanking process. This original substrate 63*a* is rectangular, and is, for example, of a size that enables a total of twenty metal base substrates 63 (five in the long side direction and four in the short side direction) to be obtained.

The original substrate 63*a* is made of a large, original metal plate 631*a* of the same material and thickness as the metal plate 631 used in the metal base substrate 63, and a large, original insulating plate 632*a* of the same material and thickness as the insulating plate 632 used in the metal base substrate 63. The original metal plate 631a and the original insulating plate 632a are integrated to form the original substrate 63a.

Here, the original metal plate 631a and the original insulating plate 632a are integrated by layering as-yet uncured resin that is to form the original insulating plate 623a on the front surface of the original metal plate 631a, and, before the resin cures, subjecting this arrangement to heating and pressuring in order to cure the resin. As a result, formation of the original insulating plate 632a and adhesion thereof to the original metal plate 631a are carried out simultaneously.

After heating (for example, 130° C.) and curing the resin of the original insulating plate 632a, the temperature of the resin is lowered to room temperature. The degree of shrinkage of the original insulating plate 632a that has been formed is lower than the stiffness of the original metal plate 631a, and therefore a precursory metal base substrate that is obtained by forming the resin of the original insulating plate 632a (the precursory metal base substrate being, in other words, the metal base substrate without the wiring pattern) is not significantly warped.

A pattern the same as the wiring pattern of the metal base substrates 63 is formed in locations corresponding to the metal base substrates 63 on the original insulating plate 632a. Each wiring pattern is formed by adhering copper foil to the original insulating plate 632a and etching the copper foil in the shape of the pattern. Note that the method described here to form the original substrate 63a and the wiring patterns is merely one example, and other methods may be used.

Next, using a blanking press, twenty metal base substrates 63 are punched out from the original substrate 63a on which the wiring patterns have been formed. This blanking press punches away a punching area 633 of the original substrate 63a, in other words, the blanking press punches the edges of the metal base substrates 63.

The blanking press has an upper die 650 and a lower die 660. As one example, the lower die 660 has an concave part 661 that recedes, in the part corresponding to the punching area 633, while the upper die 650 has an convex part 651 that protrudes, in the part corresponding to the punching area 633. As one example, the upper die 650 is vertically movable, and arranged such that when the upper die 650 is lowered, the convex part 651 advance into the concave part 661 of the lower die 660.

Figure 8B:
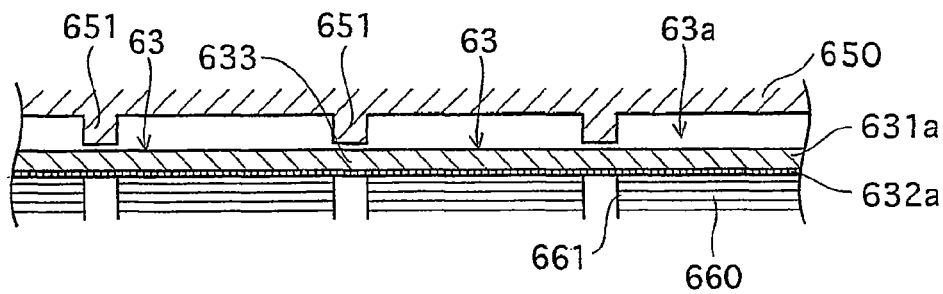
Figure 8C:
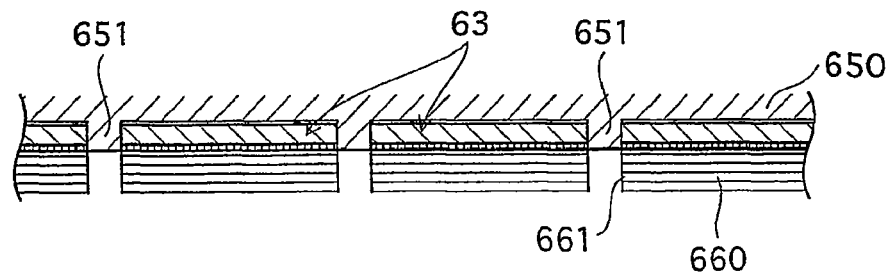

As shown in FIG. 8B, the original substrate 63a is set on the lower die 660 such that the original insulating plate 632a directly contacts the lower die 660. When the upper die 650 is lowered, the punching area 633 is punched out from around the metal base substrates 63.

Figure 8D:
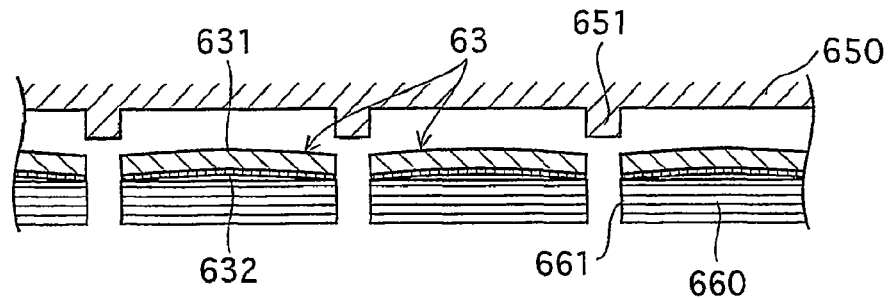

Next, as shown in FIG. 8D, the upper die 650 is raised, thereby removing the concave parts 661 from the convex parts 651. As a result, twenty metal base substrates 63 are obtained from the large original substrate 63a. The punched out metal base substrates 63 curve in a convex shape as shown in FIG. 8D. In other words, at this point the metal base substrates 63 are warped such that the central part 631b of the metal plate 631 protrudes on the opposite side to the insulating plate 632.

Next, returning to FIG. 7, the LEDS 6010 are mounted in predetermined positions on the insulating plate 632 of the metal base substrate 63. The LEDs 6010 are mounted by, for example, absorbing each LED 6010 with tip of the collet of an LED mounting device, placing the absorbed LEDs 6010 on corresponding bumps on the wiring pattern formed on the insulating plate 632, and bonding the LEDs 6010 and the bumps by applying ultrasonic waves.

Figure 7B:

Next, the LEDs 6010 are covered with the resin bodies 6020 (see FIG. 7B). This is done by, for example, placing, on the metal base substrate 63 on which the LEDs 6010 have been mounted, a plate-shaped mold that has through holes in portions corresponding to the LEDs 6010, and filling the mold via the through holes with resin that is to become the resin bodies 6020. This arrangement is then heated to cure the resin.

Figure 7C:
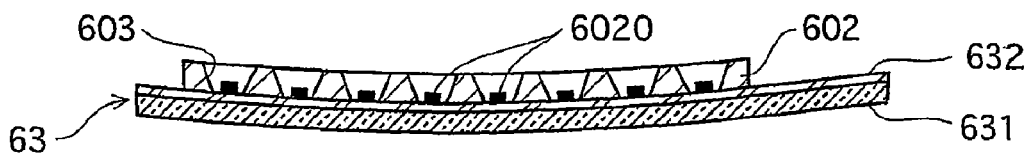

Next, the reflective plate 602 is attached to the metal base substrate 63 on which the resin bodies 6020 have been formed, as shown in FIG. 7C, such that the reflective apertures 603 correspond to the resin bodies 6020 (the LEDs). The reflective plate 602 is attached as described earlier, by adhering the reflective plate 602 and the metal base substrate 63 using a white epoxy resin layer (a resin sheet).

Figure 7D:
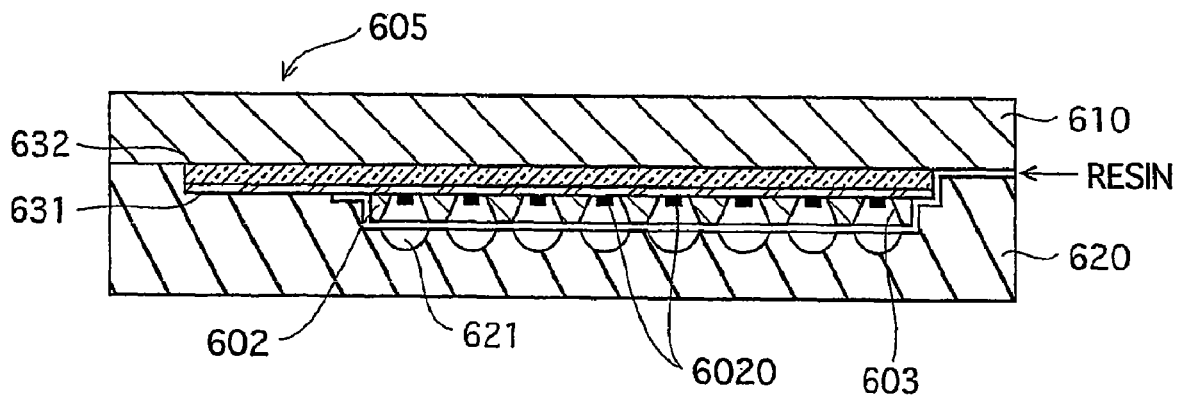
Figure 7E:
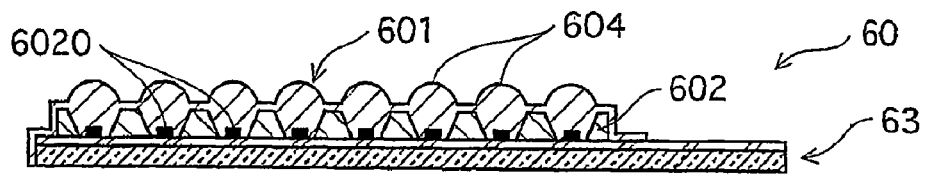

Finally, the lens member 601 is formed on the reflective plate 602 that has been attached to the metal base substrate 63, and the LED module 60 as shown in FIG. 7E is complete. The lens member 601 is formed by, as shown in FIG. 7D, injecting resin that is to become the lens member 601 into a mold 605, in other words, by using a transfer mold method. This mold 605 is, for example, a split mold that has a upper die 610 and a lower die 620, and parts 621 of the lower die 620 that correspond to the lens units 604 are semi-spherical depressions.

5. Effects

The LED module 60 having the described structure is prone to reaching particularly high temperatures at a substantially central location of the light emitting unit 62 during light emission. With the LED module 60 of the present invention, since the central part 631b that includes the part of the metal plate 631 where the high temperatures occur is in contact with the heatsink 70, the amount of heat that is conveyed to the heatsink 70 side is greater than in a conventional LED module in which the metal base substrate contacts the heatsink at edge parts.

Naturally, when the LED module 60 emits light in the described state, the heat is conveyed to the heatsink 70 through the metal plate 631. The grater the area of contact between the metal plate 631 and the heatsink 70, the greater the amount of heat that is conveyed. Hence, the present invention effectively improves heat dissipation properties over conventional structures.

While the present invention has been described based on the above embodiment, the present invention is by no means limited to the specific example given as the embodiment. The following are examples of modifications that may be made to the present invention.

1. Light Emitting Module and Warping

The light emitting (LED) module of the present invention is not limited to the structure described in the above embodiment, and may be a module such as the following.

(1) Lens Units

In the embodiment the lens member 101 is structured such that the lens units 604 protrude in semi-spherical shapes in parts corresponding to the reflective apertures 603 of the reflective plate 602, and each lens unit 604 is connected to neighboring lens units 604 by the same resin. However, it is possible for the lens units to be independent lens units, unconnected to neighboring lens units.

In such a case, when forming the resin that is to compose the lens units, the amount of warping will be reduced due to the differing heat expansion coefficient of the metal base substrate and the lens units. For this reason, in order to make the LED module in the warped form described in the embodiment, when punching out the metal base substrate it is necessary to make the central part of the metal base substrate protrude on the side opposite to the insulating plate.

Conversely, when the lens member 601 is formed with the lens units 604 connected to each other as described in the embodiment, if the amount of warping due to forming the resin of the lens member 601 is too great, the direction in which the metal base substrate is punched out should be the opposite to that in the embodiment (specifically, by setting the original substrate on the lower die with the top and bottom of the original substrate in the opposite way to described the manner in the embodiment).

(2) Reflective Plate

Although the reflective plate 602 is provided in the embodiment, it is not necessary to have a reflective plate. However, since the stiffness of the metal base substrate is considerably low if a reflective plate is not provided, there is a possibility that the if the lens unit is formed according to the transfer mold method described in the embodiment, the amount of warping will increase due to the differing heat expansion coefficient of the metal base substrate and the lens member.

Consequently, in the case of a light emitting module that lacks a reflective plate but has a lens member formed according to a transfer mold method or the like, and in which the metal base substrate exhibits an excessive amount of warping, the amount of warping can be reduced in ways such as the following. The metal base substrate may be punched out in a manner such as described in the embodiment, and a preformed lens member may be adhered to the metal base substrate on which light emitting bodies are mounted, using, for example, a resin layer (adhesive sheet). If no reflective plate is provided, lens units may be formed independently with respect to each light emitting unit. Alternatively, independent lens units may be provided respectively for each reflective aperture of the reflective plate.

2. Light Emitting Module (1) Substrate

The substrate (metal base substrate) of the embodiment is made up of an insulating plate that is a resin member and a heat conducting plate that is a metal plate, which are integrated (formation of the insulating plate in a semi-cured state and attachment thereof to the heat conducting plate being carried out simultaneously). However, it is possible to precure the resin that composes the insulating plate, and then attach the cured insulating plate to the heat conducting plate.

(2) Insulating Plate

Although the insulating plate of the embodiment is composed of thermosetting resin that includes filler, the insulating plate may be composed of another material, an example of which is glass epoxy. The number of layers composing the insulating plate is by no means limited to the one layer described in the embodiment and the insulating plate may have multiple layers. In the case of a multi-layer structure, the wiring pattern of the insulating plate may be formed on the top layer, may span all layers, or may be formed in some of the multiple layers.

(3) Heat Conducting Plate

Although a metal plate, specifically an aluminium plate, is used for the heat conducting plate of the embodiment, the heat conducting plate may be made from another material such as copper, steel, magnesium or the like. Furthermore, a material other than metal may be used, examples of which include ceramic material and resin material. However, if ceramic material is used, it is preferable to make the insulating layer ceramic also, in order to maximize the heat dissipation effect of the ceramic.

Furthermore, although the insulating plate and the heat conducting plate are substantially the same size in the embodiment, they are not limited to being any particular size, and may differ from each other in size.

(4) Light Emitting Unit

Although the light emitting unit in the embodiment has, as one example of light emitting elements, LEDs mounted on a wiring pattern on the front surface of the insulating plate, other light emitting elements may be used. One example of such light emitting elements is laser diodes (LD). However, since the light emitted from laser diodes has strong directivity, it may be necessary to provide a diffusion lens or the like to diffuse the light.

Furthermore, the light emitting bodies may be light emitting elements mounted in advance on substrates, in other words, submounts.

Figure 9:
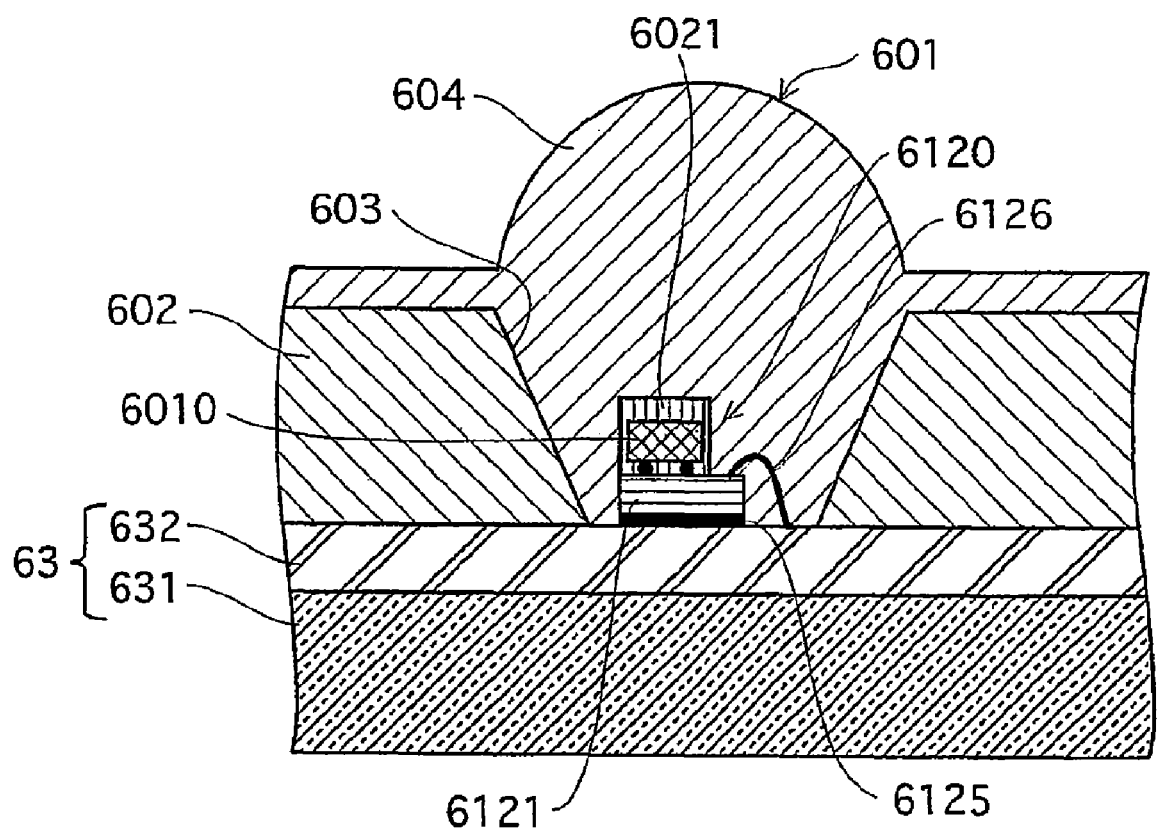
FIG. 9 shows an example of when submounts are used as light emitting bodies.

FIG. 9 shows an example of when submounts are used as light emitting bodies. Note that parts that are the same as in the first embodiment have the same numbering as in the first embodiment, and a description thereof is omitted here.

A submount 6120 is composed, for example, of a silicon substrate (hereinafter called "Si substrate") 6121, a light emitting element, such as an LED 6010, mounted on atop surface of the Si substrate 6121, and a resin body 6021 that surrounds the LED 6010.

Note that a first terminal and a second terminal are formed on a bottom surface and the top surface, respectively, of the Si substrate 6121. The first terminal is electrically connected to one electrode of the LED 6010, and the second terminal is electrically connected to the other electrode of the LED 6010.

The submount 6120 is mounted to the metal base substrate 63 by, for example, die bonding using silver paste 6125, connecting the first terminal that is on the bottom side of the Si substrate 6121 via silver paste to the wiring pattern that is on the front side of the insulating plate 632, and wire bonding the second terminal that is on the front surface of the Si substrate 6121 via a wire 6126 to the wiring pattern of the insulating plate 632.

Note since that the submount 6120, as shown in FIG. 9, mounts the LED 6010 on the Si substrate 6121 in advance, tests such as those for determining whether the mounted LED 6010 illuminates normally can be performed before the submount 6120 is mounted to the metal base substrate 63.

This means that, for example, tested submounts 6120 can be mounted to the metal base substrate 63, thus obtaining effects such as improvement in manufacturing yield. Furthermore, there is a merit that, when the color of light emitted varies between submounts 6120, submounts 6120 that are close in color can be selected, and submounts 6120 that achieve a color of light close to the desired color can be mounted together.

In the embodiment, a resin body that includes phosphor is formed in and around each LED. White light emission may be realized with this resin by a combination of blue LEDs and yellow phosphor, UV LEDs and RGB phosphor, or another combination. Alternatively, single-color LEDs, such as R, G and B, may be used.

Furthermore, instead of barechip LEDs, bullet LEDs, called SMD LEDs, or module LEDs may be used. Note that these LEDs may be mounted by flip chip mounting, or may another method such as die bonding, wire bonding, or a combination of dice bonding and wire bonding.

3. Socket

The socket 10 in the embodiment is structure to have a light passing unit, in other words the opening 110, that corresponds to the light emitting unit 62 when the socket 10 covers the LED module 60, and passes light emitted from the light emitting unit 62. However, the socket 10 may have any kind of structure provided that the edge parts of either side of the light emitting unit 62 of the insulating plate (at least edge parts that oppose each other across the light emitting unit) in the light emitting module can be pressed relative to the heatsink.

Figure 10:
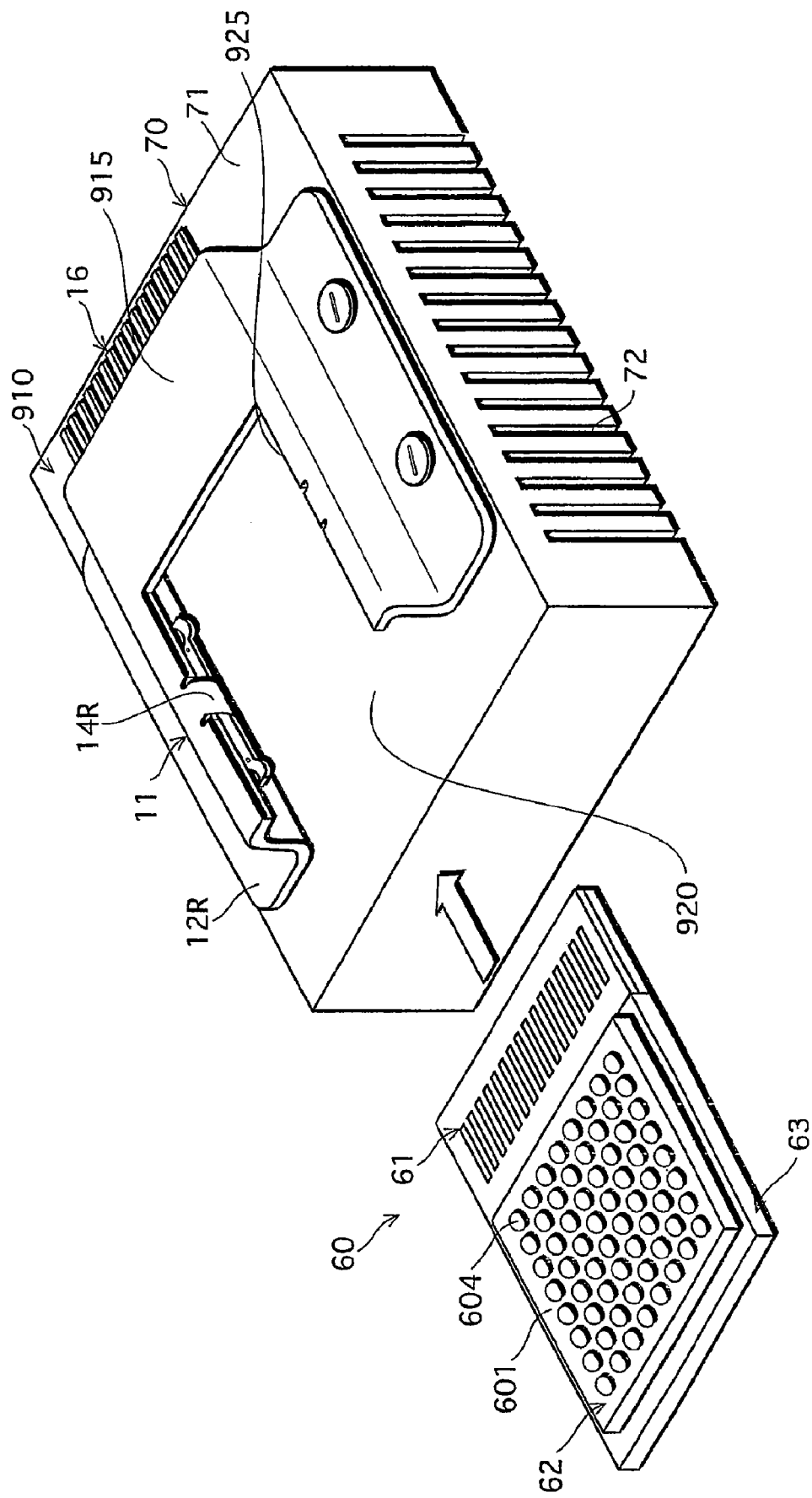
FIG. 10 is a perspective view of a modification example of the socket.

FIG. 10 is a perspective view of a modification example of the socket.

As shown in FIG. 10, a socket 910 in the present modification example differs greatly to the socket 10 of the embodiment in that it is mounted so as to press against the heatsink 70 by being slid along the flat surface 71 of the heatsink 70.

The shape of the socket 910 is essentially the same as the socket 10 in the embodiment, but it has a receiving opening 920 for receiving the light emitting module (60) which slides in to the arrangement. The receiving opening 920 is formed in the part of the socket 10 of the first embodiment that opposes power terminal unit 16, in other words, in the side of the socket that is the opposite side to the power terminal unit 16.

Pressing units that press the inserted light emitting module (60) against the heat sink 70 are provided on the sides of a cutout 925 that is on a top wall 915 of the socket and that composes the light passing unit (in other words, a total of tree places: the opposing long sides and the short side on the power terminal unit 16 side).

The socket 910 having this structure achieves substantially the same effects as the first embodiment. In other words, in the present example also, the central part of the metal plate that is the bottom side of the light emitting module (60) contacts the heatsink 70 due to the socket 10 being pushed against the heatsink 70 by the pushing parts.

Consequently, compared to a conventional light emitting module that is warped such that the central part protrudes on the insulating plate side, in the present modification example the contact part of the light emitting module and the heatsink is closer to the center of heat generated during light emission, and the heat during light emission can be conveyed effectively to the heatsink. In other words, heat dissipation properties are improved over a conventional product.

4. Pressing Units

Although the pressing units of the embodiment have an elastically deformable spring structure, pressing units that are not elastically deformable may be used. In other words, it is sufficient for the pressing units to press the light emitting module against the heatsink when the light emitting module is mounted on the heatsink. The pressing units are not limited to any particular shape, structure or the like.

Furthermore, the number of pressing units is not limited to any particular number However, it is preferable for the places that press the light emitting module against the heatsink to be at least locations opposing each other on either side of the light emitting module (to be a pair). Pressing locations that are on either side of the light emitting unit of the light emitting module and that are opposite to each other is effective in increasing the pressure with which the light emitting module is pressed against the heatsink. Furthermore, the pressure can be balanced on either side of the light emitting unit, and the light emitting module can contact the heatsink in a state of being substantially parallel with respect to the flat surface of the heatsink (This state enables the central area or a vicinity thereof of the light emitting module to contact the heatsink.). Note that the embodiment includes four pressing units in two sets of opposing locations in order to reduce the warping of the light emitting module with respect to the lengthwise direction and the short direction.

5. Lighting Device

In the lighting device in the embodiment, the light emitting module mounting surface of the heatsink is flat, and the light emitting module is warped such that the central part protrudes on the heatsink side. However, the opposite structure is possible. In other words, the surface of the light emitting module that contacts the heatsink may be flat, and the heatsink may be warped such that a central part thereof protrudes on a light emitting module side.

Figure 11:
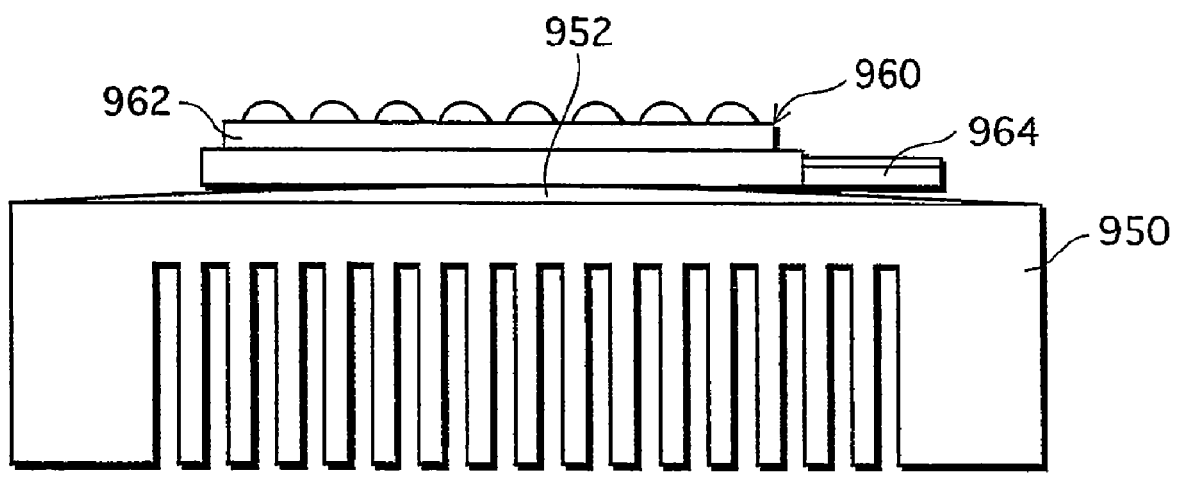
FIG. 11 is a schematic drawing showing a modification example lighting device.

FIG. 11 is a schematic drawing showing a modification example of the lighting device. Note that FIG. 11 shows only the heatsink and light emitting module that are the characteristic portions of the present modification example, and the socket for mounting the light emitting module on the heatsink is not illustrated.

The lighting device of the present modification example is composed of a heatsink 950 and a light emitting module 960 as shown in FIG. 11, and a socket that is not illustrated.

The heatsink 950, as shown in FIG. 11, is warped such that a substantially central part 952 of a surface thereof to which the light emitting module 960 is mounted protrudes on a light emitting module 960 side. Note that a substantially central part 952 of the surface of the heatsink 950 to which the light emitting module 960 is mounted is a part corresponding to a substantial center of a light emitting unit 962 of the light emitting module 960.

On the other hand, the light emitting module 960 has essentially the same structure of the LED module 60 described in the embodiment, but with the exception that the surface (the metal base substrate 964) that is mounted on the heatsink 950 is flat in the present modification example.

The lighting device having this structure achieves substantially the same effect as the embodiment. In other words, in the embodiment, the LED module is warped such the central part of the light emitting unit protrudes, and the center of the light emitting unit contacts the heatsink. However, in the present modification example, the light emitting module is flat, and the heatsink is warped such that a part thereof corresponding to the center of the light emitting unit protrudes, and contacts the center of the light emitting unit of the light emitting module.

Consequently, in the same way as the embodiment, the present modification example ensures the center of the light emitting unit of the light emitting module contacts the heatsink, and therefore the contact part of the light emitting module and the heat sink is close to the center of heat emission during light emission, and heat can be conveyed effectively to the heatsink during light emission.

6. Other Remarks (1) Light Emitting Module Warping Amount

It is desirable that the amount of warping be within a range of 0.5 μm to 10 μm per 1 mm of the dimension of a predetermined direction (length) of the light emitting module, and preferably within a range of 1 μm to 5 μm. This is because this amount of warping can be realized relatively easily and a relatively high heat dissipation effect can be obtained.

Note that the amount of warping is defined as the difference between the most protruding place and the most receding place (however, any burrs on the edge of the light emitting module are excluded).

(2) Heatsink Warping Amount

It is desirable that the amount of warping be within a range of 0.5 μm to 10 μm per 1 mm of the dimension of a predetermined direction (length) of the heatsink, and preferably within a range of 1 μm to 5 μm. This is because this amount of warping can be realized relatively easily and a relatively high heat dissipation effect can be obtained.

(3) Socket and Heatsink

Both the embodiment and the modification example have a structure in which the heatsink is larger than the socket, the socket is attached to the heatsink, and the light emitting module is pressed against the heatsink by the socket.

However, if the structure is such that, for example, the socket is attached to a main body of the lighting device and the heatsink is mounted on the main body of the lighting device, the heatsink will press the light emitting module, which is held by the socket, from the back side (the heat conducting plate side). In such a case, the light emitting module is pressed relatively, and naturally the effect of the present invention is obtained in the same way as the embodiment. In this case, the pressing units for making the light emitting module and the heatsink contact each other tightly do not have to be provided on the socket side, but may be provided, for example, on the lighting device side.

Furthermore, although the light emitting module is warped such that the central part thereof protrudes on the heat conducting plate side, it is possible for the heatsink to protrude in a substantial center of the area where the light emitting module is to the mounted (see FIG. 11). Furthermore, both the light emitting module and the area of the heatsink where the light emitting module is to be mounted may be warped such that a substantial center of both protrude toward each other.

Note that in order to obtain ideal heat dissipation properties, both the light emitting module and the heatsink would be flat, and the whole range of the heat conducting plate of the light emitting module would contact the heatsink.

(4) Shape of the Light Emitting Module

Although the light emitting module in the embodiment and the modification example has a planar shape that is rectangular, it may have a planar shape that is another shape such as square, oval, round, or a polygonal shape such as a pentagonal. In these cases also, it is suitable to provide pressing units on the socket or on another component, such that, when seen in planar view, the pressing units sandwich the light emitting unit and press either side thereof.

(5) Display Apparatus

The LED module 60 (light emitting module) of the embodiment may be used as a display apparatus with an eight line by eight row arrangement. However, in such a case, it is necessary to modify the wiring pattern such that the LEDs (light emitting bodies) can be turned on individually, and to provide a common lighting control circuit for turning on the LEDs individually to display characters, symbols, and the like.

Note that although an example of eight lines by eight rows is given here, the LEDs (light emitting bodies) are not limited to being mounted in an eight line by eight row arrangement. Furthermore, an arrangement in which a plurality (64 in the embodiment) of LEDs (light emitting bodies) are mounted on a substrate as described in the embodiment may be used as one of a plurality of light sources in a display apparatus.

INDUSTRIAL APPLICABILITY

The present invention can be used for improving heat dissipation properties in a light emitting module mounted on a heatsink by a socket, and in a lighting device and a display device in which the fight emitting module is mounted on a heatsink by a socket.

The invention claimed is:

1. A light emitting module used mounted on a heatsink, the light emitting module comprising:
   a substrate protruding on a side of the heatsink;
   a light emitting unit provided on a surface of the substrate in a central area of the substrate; and
   a power unit, provided on the surface of the substrate and connected to external terminals from which the power unit receives power, wherein press receiving portions are located on both sides of the light emitting unit on the surface of the substrate, and an amount of warping of the substrate falls in a range of 0.5 μm to 10 μm per 1 mm of length in a predetermined direction along the substrate, wherein the substrate is composed of one or more insulating plates and a heat conducting plate.

2. The light emitting module of claim 1, wherein the insulating plate is either (i) thermosetting resin that includes filler, or (ii) glass epoxy.

3. The light emitting module of claim 1, wherein the insulating plate and the heat conducting plate differ in size.

4. The light emitting module of claim 1, wherein the amount of warping of the substrate falls in a range of 1 μm to 5 μm per 1 mm of length in a predetermined direction along the substrate.

5. The light emitting module of claim 1, wherein the light emitting unit includes either one or more light emitting elements or two or more light emitting elements, and the light emitting elements are either LEDs or laser diodes.

6. The light emitting module of claim 1, wherein a planar shape of the substrate is rectangular, square, oval, round, or a polygonal shape.

7. A light emitting module used mounted on a heatsink, the light emitting module comprising:
   a substrate protruding on a side of the heatsink;
   a light emitting unit provided on a surface of the substrate in a central area of the substrate, the light emitting unit includes a plurality of light emitting bodies;
   a power unit, provided on the surface of the substrate and connected to external terminals from which the power unit receives power, wherein press receiving portions are located on both sides of the light emitting unit on the surface of the substrate, and an amount of warping of the substrate falls in a range of 0.5 μm to 10 82 m per 1 mm of length in a predetermined direction along the substrate; and
   a reflective plate for reflecting light emitted from the light emitting bodies is provided on the surface of the substrate.

8. The light emitting module of claim 7, wherein the amount of warping of the substrate falls in a range of 1 μm to 5 μm per 1 mm of length in a predetermined direction along the substrate.

9. The light emitting module of claim 7, wherein the substrate is composed of a high heat conducting member.

10. The light emitting module of claim 9, wherein the high heat conducting member is made of any material selected from a group consisting of metal, ceramic material, or thermosetting resin that includes filler.

11. The light emitting module of claim 7, wherein the light emitting unit includes either one or more light emitting elements or two or more light emitting elements, and the light emitting elements are either LEDs or laser diodes.

12. The light emitting module of claim 7, wherein a planar shape of the substrate is rectangular, square, oval, round, or a polygonal shape.

13. A light emitting module used mounted on a heatsink, the light emitting module comprising:
   a substrate protruding on a side of the heatsink;
   a light emitting unit provided on a surface of the substrate in a central area of the substrate;

a lens for controlling distribution of light from the light emitting unit; and a power unit, provided on the surface of the substrate and connected to external terminals from which the power unit receives power, wherein press receiving portions are located on both sides of the light emitting unit on the surface of the substrate, and an amount of warping of the substrate falls in a range of 0.5 µm to 10 µm per 1 mm of length in a predetermined direction along the substrate.

14. The light emitting module of claim 13, wherein the amount of warping of the substrate falls in a range of 1 µm to 5 µm per 1 mm of length in a predetermined direction along the substrate.

15. The light emitting module of claim 13, wherein the substrate is composed of a high heat conducting member.

16. The light emitting module of claim 15, wherein the high heat conducting member is made of any material selected from a group consisting of metal, ceramic material, or thermosetting resin that includes filler.

17. The light emitting module of claim 13, wherein the light emitting unit includes either one or more light emitting elements or two or more light emitting elements, and the light emitting elements are either LEDs or laser diodes.

18. The light emitting module of claim 13, wherein a planar shape of the substrate is rectangular, square, oval, round, or a polygonal shape.

19. A lighting device comprising:
a light emitting module;
a heatsink;
a substrate protruding on a side of the heatsink and contiguous with the heatsink;
a light emitting unit provided on a surface of the substrate in a central area of the substrate;
a power unit, provided on the surface of the substrate and connected to external terminals from which the power unit receives power, wherein press receiving portions are located on both sides of the light emitting unit on the surface of the substrate, and an amount of warping of the substrate falls in a range of 0.5 µm to 10 µm per 1 mm of length in a predetermined direction along the substrate; and
a socket mounted on the heatsink such that a light emitting unit of the light emitting module is on a front side.

20. The light device of claim 19, wherein
the socket includes a plurality of pressing units for pressing the substrate on a side of the heatsink, and
the pressing units press the press receiving units located at two opposite edge parts of the substrate, which has a rectangular shape.

21. The lighting device of claim 19, wherein
the socket includes a power terminal electrically connected to a power unit in the light emitting module.

22. The lighting device of claim 19, wherein
a central part of an area of the heatsink in which the light emitting module is to be mounted protrudes on a side of the light emitting module.

23. The lighting device of claim 19, wherein
an amount of protrusion of the heatsink falls in a range of 0.5 µm to 10 µm per 1 mm of length in a predetermined direction along the heatsink.

24. The lighting device of claim 23, wherein
the amount of protrusion of the heatsink falls in a range of 1 µm to 5 µm per 1 mm of length in a predetermined direction along the heatsink.

25. The light emitting device of claim 19, wherein
the amount of warping of the substrate falls in a range of 1 µto 5 µm per 1 mm of length in a predetermined direction along the substrate.

26. The light emitting device of claim 19, wherein
the substrate is composed of a high heat conducting member.

27. The light emitting device of claim 26, wherein
the high heat conducting member is made of any material selected from a group consisting of metal, ceramic material, or thermosetting resin that includes filler.

28. The light emitting device of claim 19, wherein
the light emitting unit includes either one or more light emitting elements or two or more light emitting elements, and the light emitting elements are either LEDs or laser diodes.

29. The light emitting device of claim 19, wherein
the heatsink is a part of a body of either a lighting device or a display device.

30. The light emitting device of claim 19, wherein
a planar shape of the substrate is rectangular, square, oval, round, or a polygonal shape.

* * * * *